(12) United States Patent
Leigh et al.

(10) Patent No.: US 10,542,640 B1
(45) Date of Patent: Jan. 21, 2020

(54) LIQUID CHAMBER HOUSINGS

(71) Applicant: Hewlett Packard Enterprise Development LP, Houston, TX (US)

(72) Inventors: Kevin B. Leigh, Houston, TX (US); John Franz, Houston, TX (US); Everett Salinas, Pasadena, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/143,775

(22) Filed: Sep. 27, 2018

(51) Int. Cl.
*H05K 7/20* (2006.01)
*H05K 1/02* (2006.01)

(52) U.S. Cl.
CPC ....... *H05K 7/20772* (2013.01); *H05K 1/0203* (2013.01); *H05K 7/20236* (2013.01); *H05K 7/20272* (2013.01); *H05K 7/20809* (2013.01)

(58) Field of Classification Search
CPC ........... H05K 7/20218; H05K 7/20236; H05K 7/20272; H05K 7/20627; H05K 7/20636; H05K 7/20763–20772; H05K 7/20872; H05K 7/20927; H05K 1/0201–0203
USPC .................................................. 361/699–701
See application file for complete search history.

(56) References Cited

U.S. PATENT DOCUMENTS

| | | | |
|---|---|---|---|
| 5,150,274 A * | 9/1992 | Okada | H01L 23/3733 165/185 |
| 6,005,771 A * | 12/1999 | Bjorndahl | H01L 23/427 165/185 |
| 6,052,284 A * | 4/2000 | Suga | H01L 23/473 165/80.4 |
| 6,222,122 B1 * | 4/2001 | Davidson | H05K 5/062 174/554 |
| 6,661,664 B2 * | 12/2003 | Sarno | H05K 7/20545 165/104.33 |
| 6,938,678 B1 * | 9/2005 | Bortolini | H05K 7/20636 165/80.4 |
| 7,477,513 B1 * | 1/2009 | Cader | H01L 23/4735 165/80.4 |
| 7,724,524 B1 | 5/2010 | Campbell et al. | |
| 7,916,483 B2 | 3/2011 | Campbell et al. | |
| 8,947,873 B2 | 2/2015 | Campbell et al. | |
| 9,282,678 B2 | 3/2016 | Campbell et al. | |
| 9,686,889 B2 | 6/2017 | Campbell et al. | |
| 9,711,432 B2 * | 7/2017 | Riou | H01L 23/44 |
| 9,943,016 B2 * | 4/2018 | Pietrantonio | H05K 7/20927 |

(Continued)

OTHER PUBLICATIONS

John Boyd, "Fujitsu Liquid Immersion Not All Hot Air When it Comes to Cooling Data Centers." May 18, 2017, pp. 1-4 (online), IEEE Spectrum. Retrieved from the Internet on May 15, 2018 at URL: <spectrum.ieee.org/tech-talk/computing/hardware/fujitsu-liquid-immersion-not-all-hot-air-when-it-comes-to-cooling-data-centers>.

(Continued)

*Primary Examiner* — Zachary Pape
(74) *Attorney, Agent, or Firm* — Brooks, Cameron & Huebsch, PPL

(57) ABSTRACT

Liquid chamber housings are described herein. In one example, an apparatus for liquid chamber housings can include a first housing segment coupled to a first side of a board and a second housing segment coupled to a second side of the board to create a liquid chamber for a portion of the board between the first housing segment and the second housing segment.

18 Claims, 8 Drawing Sheets

(56) References Cited

U.S. PATENT DOCUMENTS

2003/0227750 A1* 12/2003 Glovatsky .......... H05K 7/20454
361/699
2008/0302115 A1* 12/2008 Eknes .................... H05K 5/068
62/183
2018/0303010 A1* 10/2018 Kerner ............... H05K 7/20881

OTHER PUBLICATIONS

Wikipedia, "Server immersion cooling", available online at <https://en.wikipedia.org/w/index.php?title=Server_immersion_cooling&oldid=856525633>, Aug. 25, 2018, 6 pages.

* cited by examiner

LIQUID CHAMBER HOUSINGS

BACKGROUND

Computing devices can utilize liquid cooling systems that can circulate a liquid, such as water, throughout the computing device to cool heat generating components such as processors, memory resources, and/or other electrical components. Different components of the computing device can generate different quantities of heat. These different components may have different heights and they may be disposed on a printed circuit boards (PCBs) or on different PCBs within the computing device. In some examples, components that provide a relatively higher performance can also generate a relatively greater quantity of heat. In some examples, computing devices can utilize relatively higher performing components within the same or similar footprint, which can generate a greater quantity of heat within the same or similar footprint.

DETAILED DESCRIPTION

Figure 1:
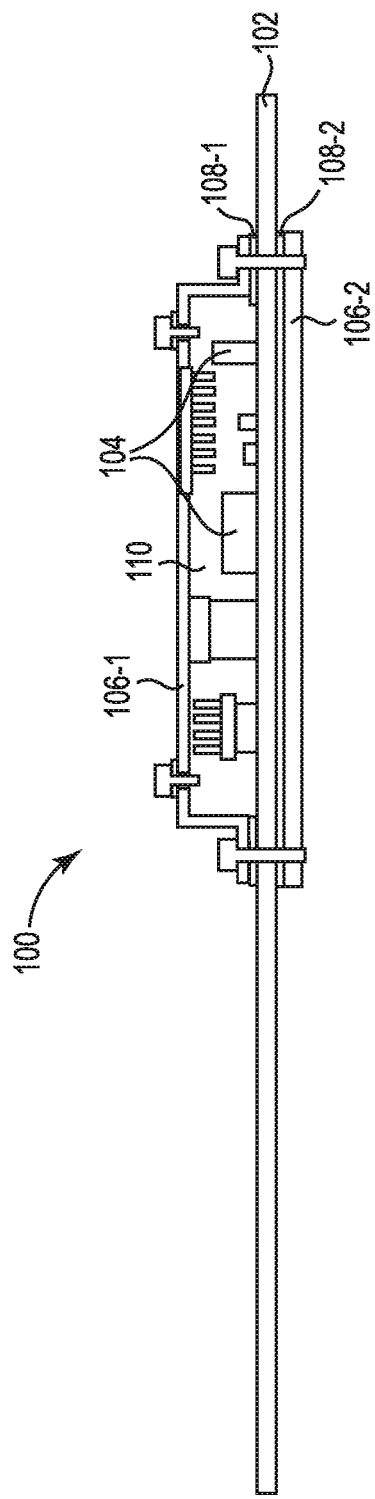
FIG. 1 illustrates an example circuit assembly comprising housing segments to generate a liquid chamber.

Immersion cooling is a form of liquid cooling in which electronic components are immersed in the liquid coolant, meaning the liquid coolant directly contacts the electronic component and therefore the liquid coolant may be a dielectric to avoid short circuiting and/or damaging the electronic component. The direct contact of coolant to components may improve the transfer of heat from the component to the coolant. In some approaches, which may be called "full immersion" cooling, an entire computing device (e.g., an entire circuit assembly) is immersed in a tub or vat of liquid coolant. However, full immersion cooling can be costly, as it may require custom server room equipment and large volumes of dielectric liquid coolant and may make installing and/or servicing the computing devices difficult.

Accordingly, to solve these and other problems, disclosed herein are examples of immersion cooling techniques in which a localized liquid chamber is formed on a portion of a circuit assembly, with some components of the circuit assembly being inside the chamber to be cooled by liquid coolant inside the chamber, but without encompassing all of the circuit assembly in the liquid chamber. Specifically, in some examples, housings can be sealed to opposite faces of a board of the circuit assembly to generate a liquid chamber that can be filled with a liquid such as a dielectric liquid to cool electrical components that are within the liquid chamber. For example, a first housing segment and a second housing segment can be coupled to a board of a circuit assembly to generate a liquid chamber between the first housing and the second housing. In this example, the liquid chamber can enclose a plurality of electrical components and can be filled with a dielectric liquid that can be utilized to remove heat from the plurality of electrical components.

Because the liquid chamber encompasses only a portion of the circuit assembly, the examples disclosed herein may require much less dielectric liquid than full immersion cooling techniques, and thus may be less costly. In addition, because the liquid chamber may be attached onto the circuit assembly at manufacturing time and thereafter becomes, essentially, just another part of the overall circuit assembly, there may be little-to-no added complexity for a customer to use the circuit assembly with the liquid chamber as compared to using a typical server. For example, it may be possible in some examples to use standard server room equipment to house and interface with the example computing devices (e.g., standard racks, standard liquid cooling systems, etc.), thus avoiding the cost and difficulty the custom equipment that might be needed for full-immersion cooling (e.g., fully immerse racks).

In some examples, the liquid chamber encloses only a portion of the electrical components that make up or are coupled to the board of the circuit assembly. In this way, a first portion of electrical components can be enclosed within a liquid chamber to be cooled utilizing immersion cooling and a second portion of electrical components can be exposed to be cooled by a different method of cooling. For example, a first portion of a plurality of electrical components coupled to a board of a circuit assembly can be enclosed by the housing segments and cooled utilizing a dielectric liquid and a second portion of the plurality of electrical components can be coupled to a cold plate then circulates a liquid or coolant through the cold plate. This may be beneficial in some circumstances because the components of the circuit assembly that are not housed within the liquid chamber may be more easily accessed. Components may need to be accessed, for example, to service them, to upgrade them, to add or change connections, etc.

For example, the components outside of the liquid chamber may be accessed in the same way that those components would be accessed in a typical server, thus avoiding the mess and difficulty associated with accessing components in a full immersion system. In addition, the components within the liquid chamber may be differently sized and/or shaped, which can make it difficult to utilize other methods or systems of cooling. Furthermore, electrical components that generate a relatively lower quantity of heat can be positioned within the liquid chamber and electrical components that generate a relatively greater quantity of heat can be cooled with cold plates or relatively more efficient cooling methods.

In another example, the components outside of the liquid chamber may have optical connectors to interface with modularly pluggable optical cables. These optical connectors may be of a lens type and may have an air gap between the optical connectors. Immersing the lens type optical connectors in a dielectric liquid may cause the dielectric liquid to be in the light signal path between the lens connectors, and may negatively affect the optical signal characteristics, such as deflection angle, and cause optical signal misalignment that in turn will cause optical signal losses. Furthermore, the optical cables may need to be removed for servicing (e.g., repairing a damaged optical fiber of an optical cable). Keeping the optical components outside the liquid chamber will avoid the performance and servicing impact of the optical connectors.

In some examples, the electrical components that are contained within the liquid chamber may be of different sizes and/or are different types of electrical components and/or may have irregular surfaces. For example, the housing segments can be utilized to generate a liquid chamber over a portion of the circuit assembly that includes a plurality of different electrical components. In some examples, the different electrical components can include different heights and/or widths, which can be difficult to be cooled with other cooling methods. Such components may be difficult to be cooled using traditional liquid cooling techniques, since it may be difficult to obtain good thermal contact with the different components. For example, although some larger components like a CPU are relatively easy to be cooled using traditional liquid cooling techniques, as they generally have a large flat surface to which a cold plate can be thermally coupled, smaller components (e.g., voltage regulators, etc.) and the like may be difficult to be cooled using traditional liquid cooling techniques. For example, it may be difficult to couple cold plates to these smaller components (due to their sizes and/or irregular surfaces). They may also be too minor to warrant their own individual cold plates, and they may be too irregularly sized and shaped for all of them to make good thermal contact with a single shared cold plate.

However, when these components are housed within the liquid chamber, the liquid coolant can directly contact them, thus providing sufficient thermal transfer from all of these components to the liquid coolant, notwithstanding their differences in size and/or shape and/or their surface irregularities. In another example, small and irregular size components may be disposed on different PCBs, such as a small removable adapter PCB (a memory device in the industry standard M.2 form factor) is installed on a right-angled electrical connector fix-mounted on a system PCB. The removable device may allow flexible system configuration during the manufacturing time, and the removable device may not be required to be removed after it is installed. Attaching a cold plate to the removable adapter PCB may be impractical because of difficulty to support the amount of pressure of the cold plate on the removable adapter PCB, and the cost involves in designing the structural support for the removable device cantilevered off the right-angle electrical connector, as well as the cold plate and traditional liquid cooling plumbing. However, when the removable device is housed within the liquid chamber, the liquid coolant can directly contact the multiple small components on the removable device, thus providing sufficient thermal transfer from all of these components to the liquid coolant, notwithstanding their differences in size and/or shape, their surface irregularities, and/or the removable device structural support.

FIG. 1 illustrates an example circuit assembly 100 comprising housing segments 106-1, 106-2 to form a liquid chamber 110. In some examples, the circuit assembly 100 includes a liquid chamber 110 that is formed by a first housing segment 106-1 and a second housing segment 106-2 that are sealed to opposite sides of a board 102 of the circuit assembly 100. The liquid chamber 110 encloses a number of electrical components 104 coupled to the board 102. As used herein, a liquid chamber 110 can include a space with a volume that can include a liquid tight sealed area/volume that can contain a dielectric liquid that can remove heat from electrical components 104.

As used herein, a circuit assembly 100 can include a board 102 and electrical components 104 that are connected to the board 102. The board 102 is a substrate providing mechanical support for the electrical components 104 and may also include electrical connections embedded therein (or thereon) for the electrical components 104. In some examples, the circuit assembly 100 can be a printed circuit board (PCB) or printed circuit assembly (PCA) that can include layers of non-conductive material with conductive tracks, pads or features positioned between the layers of non-conductive material. In some examples, the conductive tracks can connect a first electrical component 104 to a second electrical component 104 coupled to the board 102 and/or to a connector coupled to the board 102 to connect an electrical component 104 to a different computing device or computing system.

In some examples, the liquid chamber 110 can be constructed by a first housing segment 106-1 coupled to a first side of the board 102 and a second housing segment 106-2 coupled to a second side of the board 102. For example, the liquid chamber 110 can be constructed by a first housing segment 106-1 coupled to a top side of the board 102 as illustrated in FIG. 1 and a second housing segment 106-2 coupled to a bottom side of the board 102 as illustrated in FIG. 1. Specifically, the liquid chamber 110 comprises the volume that is enclosed between the first and second housing segments 106-1, 106-2. In the example of FIG. 1, the first housing segment 106-1 is concave, while the second housing segment 106-2 is a flat plate or substantially flat plate. In some examples, a side of the board 102 can include a surface of the board 102 that can be utilized to connect electrical components 104. For example, a side of the board 102 can include conductive tracks, pads, plated through holes (PTHs), or features that can be coupled to the electrical components 104 to provide communication channels and/or electrical supplies to the electrical components 104. The board 102 or circuit assembly 100 may have holes to mount components, such as finned structures such as heat-sinks.

In some examples, the circuit assembly 100 can include a first gasket 108-1 and a second gasket 108-2. For example, the circuit assembly 100 can include a first gasket 108-1 positioned between the first housing segment 106-1 and the first side of the board 102 and a second gasket 108-2 positioned between the second housing segment 106-2 and the second side of the board 102. In this example, the first gasket 108-1 can be positioned to seal a border of the first housing segment 106-1 and the second gasket 108-2 can be positioned to seal at least a border of the second housing segment 106-2.

In some examples, the first gasket 108-1 can be positioned between the first housing segment 106-1 and a surface of the first side of the board 102. In some examples, the first gasket 108-1 can provide a liquid tight seal between the first housing segment 106-1 and the surface of the first side of the board 102. In this way, the first housing segment 106-1 and the first gasket 108-1 can generate a first portion of the liquid chamber 110 positioned on the first side of the board 102. In a similar way, the second gasket 108-2 can be positioned between the second housing segment 106-1 and a surface of the second side of the board 102. In some examples, the second gasket 108-2 can provide a liquid tight seal between the second housing segment 106-2 and the surface of the second side of the board 102. In this way, the liquid chamber 110 can be defined by the first housing segment, 106-1, the first gasket 108-1, the second housing segment 106-2, and the second gasket 108-2.

In some examples, the second gasket 108-2 can cover substantially all of the second housing segment 106-2. For example, the second gasket 108-2 can generate a liquid tight seal around a perimeter of the second housing segment 106-2 as well as in the area between the edges of the second housing segment 106-2. In this way, apertures or holes through or within the board 102 can be sealed by the second gasket 108-2 to prevent a dielectric liquid within the liquid chamber 110 from moving from the first side of the board 102 (e.g., top side of the board 102) to the second side of the board 102 (e.g., bottom side of the board 102). In some examples, the housing segments 106 may be sealed liquid tight to the board 102 without using the gaskets 108. For example, an adhesive or caulk may be used in place of the gaskets 108 to ensure a liquid tight seal.

As described herein, the liquid chamber 110 can be filled with a liquid such as a dielectric liquid via filler holes or apertures positioned on a top side of the first housing segment 106-1. The filler holes or apertures can include plugs to contain the dielectric liquid in the liquid chamber 110. As used herein, a dielectric liquid can include a dielectric material in a liquid state or any liquid that has dielectric properties. As used herein, a dielectric material can be a material that is an electrical insulator that can be polarized by an applied electric field. For example, a dielectric liquid can include, but is not limited to: mineral oil, castor oil, silicone oil, and/or polychlorinated biphenyls. In some examples, the liquid chamber 110 can be filled with a dielectric liquid to provide immersion cooling for electrical components 104 positioned within the liquid chamber 110. For example, heat generated by the electrical components can be transferred to the dielectric liquid within the liquid chamber 110. In this example, the heat transferred into the dielectric liquid can be transferred to the first housing segment 106-1. In some examples, a component 104 within the first housing segment 106-1 may have a heat sink attached to increase the thermal conduction area to transfer heat from the component to the dielectric liquid. In yet another example, the first housing segment 106-1 may have fins to increase the area to absorb heat from the dielectric liquid. Component heat sink and housing segment fins are both immersed in dielectric liquid to efficiently conduct heat to the dielectric liquid. In other examples, a component might have a thermal gap pad directly contacted to its heat generation surface where the opposing surface of the thermal gap pad contacts to the underside of the first housing segment 106-1 to directly transfer heat from the component 104 to the first housing segment 106-1. The heat may then be removed from the first and/or second housing segments 106-1, 106-2 using a cooling system, such as an air or liquid cooling system (not shown in FIG. 1).

In some examples, the circuit assembly 100 can be utilized to provide immersion cooling for electrical components 104 within the liquid chamber 110 while utilizing a different cooling method or cooling system for electrical components 104 positioned outside the liquid chamber 110. In addition, the circuit assembly 100 can be utilized with other types of cooling methods and/or cooling systems as described further herein.

Figure 2:
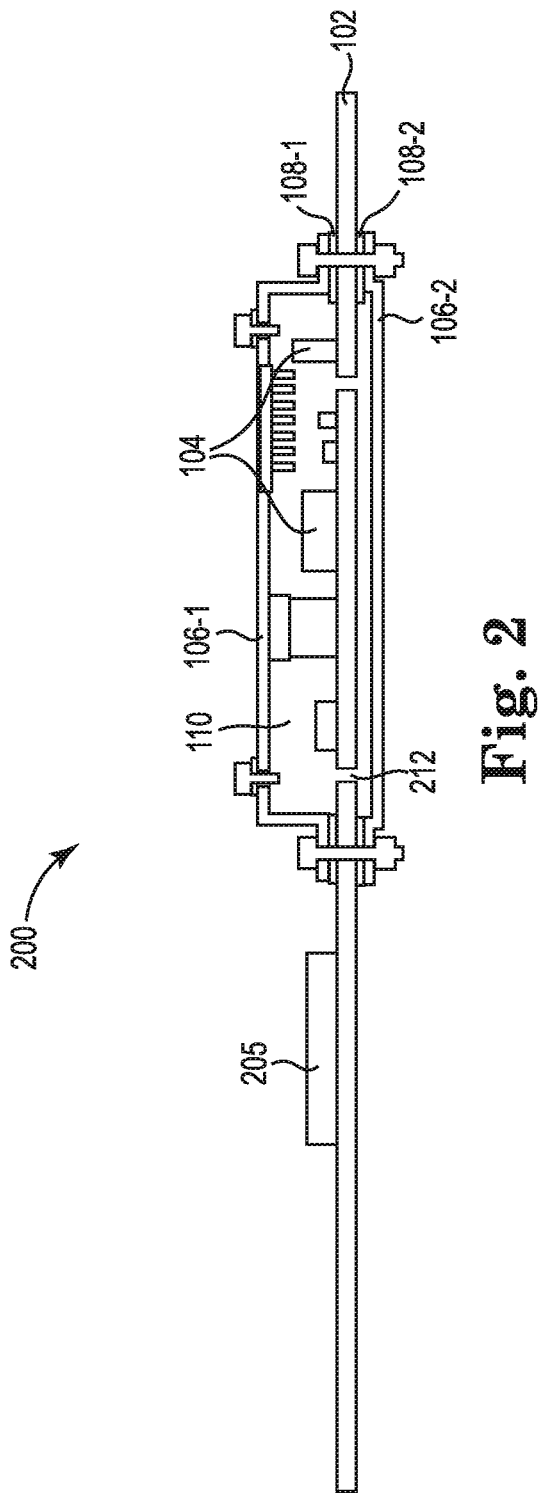
FIG. 2 illustrates an example circuit assembly comprising housing segments to generate a liquid chamber.

FIG. 2 illustrates an example circuit assembly 200 for liquid chamber housings. In some examples, the circuit assembly 200 can be a similar circuit assembly to the circuit assembly 100 as referenced in FIG. 1. For example, the circuit assembly 200 can be utilized to generate a liquid chamber 110 with a first housing segment 106-1 and a second housing segment 106-2 to enclose a first portion of electrical components 104 and not enclose a second portion of electrical components 205 coupled to a board 102. Specifically, FIG. 2 illustrates the circuit assembly 100 of FIG. 1 with an electrical component 205 positioned outside the liquid chamber 110. As used herein, a liquid chamber 110 can include an area that can include a liquid tight sealed area that can receive a dielectric liquid that can remove heat from electrical components 104.

In some examples, the liquid chamber 110 can be constructed by a first housing segment 106-1 coupled to a first side of the board 102 and a second housing segment 106-2 coupled to a second side of the board 102. For example, the liquid chamber 110 can be constructed by a first housing segment 106-1 coupled to a top side of the board 102 of the circuit assembly 200 as illustrated in FIG. 2 and a second housing segment 106-2 coupled to a bottom side of the board 102 of the circuit assembly 200 as illustrated in FIG. 2. The first housing segment 106-1 is concave. In some examples, the second housing segment 106-2 is a flat plate (as illustrated in FIG. 1). In some other examples, the second segment 106-2 is concave (as illustrated in FIG. 2).

In FIG. 2, a volume is shown between the second housing segment 106-2 and the board 102. In some examples, such a volume may be substantial (non-negligible) and may be formed deliberately by using a concave second segment 106-2 to accommodate low-profile devices such as a bolster plate (not shown) to prevent warpage of the board 102 when a component 104 is secured to the board 102 by a mounting device (not shown). As used herein, a bolster plate can be a flat surface or substantially flat surface that can be positioned to anchor an object or electrical component 104. As used herein, the mounting device can be a device utilized to stabilize or couple an electrical component 104 to the board 102. In some examples, the mounting device can be positioned on a surface of the electrical component 104 coupled to the first side of the board 102 and can be connected to the bolster plate positioned on the second side of the board 102. However, in other examples, the volume may be too small to appreciate visually—for example, the second housing segment 106-2 may be a flat plate, and the volume between the second housing segment 106-2 and the board 102 may be just that resulting from their microscopic surface irregularities.

In some examples, the circuit assembly 200 can include a first gasket 108-1 and a second gasket 108-2. In some examples, the first gasket 108-1 can be positioned between the first housing segment 106-1 and a surface of the first side of the board 102. In some examples, the first gasket 108-1 can provide a liquid tight seal between the first housing segment 106-1 and the surface of the first side of the board 102. In this way, the first housing segment 106-1 and the first gasket 108-1 can generate a first portion of the liquid chamber 110 positioned on the first side of the board 102 of the circuit assembly 200. In a similar way, the second gasket 108-2 can be positioned between the second housing segment 106-1 and a surface of the second side of the board 102 of the circuit assembly 200.

In some examples, the board 102 can include apertures 212 or holes in the board 102. In some examples, the apertures 212 can allow the dielectric liquid within the liquid chamber 110 to move from the first side of the board 102 of the circuit assembly 200 (e.g., top side, etc.) to the second side of the board 102 of the circuit assembly 200 (e.g., bottom side, etc.). In some examples, allowing the dielectric liquid within the liquid chamber 110 to flow from the first side of the board 102 to the second side of the board 102 can allow heat to be transferred from the dielectric liquid into the first housing segment 106-1 and/or the second housing segment 106-2. As will be described further herein, heat pipes, liquid cooling supply lines, and/or other cooling devices can be coupled to the first housing segment 106-1 and/or the second housing segment 106-2 to remove heat from the circuit assembly 200. In some examples, some or all of the apertures 212 may be provided deliberately to allow liquid to move from one side of the board 102 to the other. In some examples, some or all of the apertures 212 may not be provided deliberately to enable liquid transfer, and may be, for example, the result of through holes for electrical connections, natural pores or imperfections, or the like. Although the apertures 212 are described herein in relation to the apparatus 200 for sake of illustration, it should be understood that any of the examples described herein may include apertures or holes like the apertures 212. In some examples, some or all of the apertures 212 may be provided deliberately to allow liquid to move from one side of the board 102 to the other. In some examples, some or all of the apertures 212 may not be provided deliberately to enable liquid transfer, and may be, for example, the result of through holes for electrical connections, natural pores or imperfections, or the like. Although the apertures 212 are described herein in relation to the apparatus 200 for sake of illustration, it should be understood that any of the examples described herein may include apertures or holes like the apertures 212.

As described herein, the liquid chamber 110 can be filled with a liquid such as a dielectric liquid. As described herein, the liquid chamber 110 can be filled with a dielectric liquid to provide immersion cooling for electrical components 104 positioned within the liquid chamber 110. For example, heat generated by the electrical components 104 can be transferred to the dielectric liquid within the liquid chamber 110. In this example, the heat transferred into the dielectric liquid can be transferred to the first housing segment 106-1 and/or the second housing segment 106-2. In some examples, the liquid chamber 110 can provide immersion cooling to the electrical components 104 positioned on a first portion of the circuit assembly 200 while allowing electrical components 205 positioned on a second portion of the circuit assembly 200 to be cooled by a different cooling device and/or cooling system.

In some examples, the circuit assembly 200 can be utilized to provide immersion cooling for electrical components 104 within the liquid chamber 110 while utilizing a different cooling method or cooling system for electrical components 205 positioned outside the liquid chamber 110. In addition, the circuit assembly 200 can be utilized with other types of cooling methods and/or cooling systems as described further herein.

Figure 3:
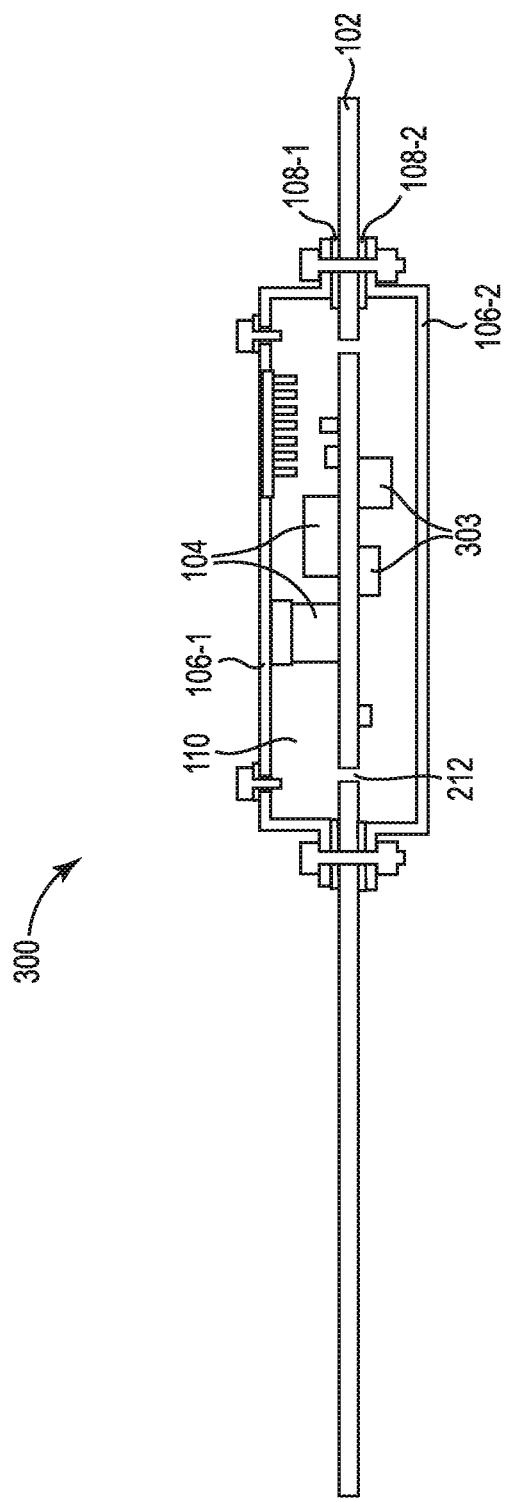
FIG. 3 illustrates an example circuit assembly comprising housing segments to generate a liquid chamber.

FIG. 3 illustrates an example circuit assembly 300 for liquid chamber housings. In some examples, the circuit assembly 300 can be a similar circuit assembly to the circuit assembly 100 as referenced in FIG. 1 and/or circuit assembly 200 as referenced in FIG. 2. For example, the circuit assembly 300 can be utilized to generate a liquid chamber 110 with a first housing segment 106-1 and a second housing segment 106-2 to enclose a first portion of electrical components 104 coupled to a first side of a board 102 and a second portion of electrical components 303 coupled to a second side of the board 102. Specifically, FIG. 3 illustrates the elements of the circuit assembly 100 and the circuit assembly 200 with additional electrical components 303 coupled to a second side of the board 102. As used herein, a liquid chamber 110 can include an area that can include a liquid tight sealed area that can receive a liquid such as a dielectric liquid that can remove heat from electrical components 104 and/or electrical components 303.

In some examples, the liquid chamber 110 can be constructed by a first housing segment 106-1 coupled to a first side of the board 102 and a second housing segment 106-2 coupled to a second side of the board 102. For example, the liquid chamber 110 can be constructed by a first housing segment 106-1 coupled to a top side of the board 102 of the circuit assembly 300 as illustrated in FIG. 3 and a second housing segment 106-2 coupled to a bottom side of the board 102 of the circuit assembly 300 as illustrated in FIG. 3.

In some examples, the circuit assembly 300 can include a first gasket 108-1 and a second gasket 108-2. In some examples, the first gasket 108-1 can be positioned between the first housing segment 106-1 and a surface of the first side of the board 102. In some examples, the first gasket 108-1 can provide a liquid tight seal between the first housing segment 106-1 and the surface of the first side of the board 102. In this way, the first housing segment 106-1 and the first gasket 108-1 can generate a first portion of the liquid chamber 110 positioned on the first side of the board 102 to enclose the electrical components 104 coupled to the first side of the board 102. In a similar way, the second gasket 108-2 can be positioned between the second housing segment 106-1 and a surface of the second side of the board 102 to enclose the electrical components 303 coupled to the second side of the board 110.

In some examples, the board 102 can include apertures 212 or holes in the board 102. In some examples, the apertures 212 can allow the dielectric liquid within the liquid chamber 110 to move from the first side of the board 102 of the circuit assembly 300 (e.g., top side, etc.) to the second side of the board 102 of the circuit assembly 300 (e.g., bottom side, etc.). In some examples, allowing the dielectric liquid within the liquid chamber 110 to flow from the first side of the board 102 to the second side of the board 102 can allow heat to be transferred from the dielectric liquid into the first housing segment 106-1 and/or the second housing segment 106-2. As will be described further herein, heat pipes, liquid cooling supply lines, and/or other cooling devices can be coupled to the first housing segment 106-1 and/or the second housing segment 106-2 to remove heat from the circuit assembly 300.

In some examples, the apertures 212 can allow the dielectric liquid to provide immersion cooling to the electrical components 104 positioned on the first side of the board 102 and to the electrical components 303 positioned on the second side of the board 102. In some examples, the apertures 212 can be utilized to circulate the dielectric liquid or liquid within the liquid chamber 110 from the first side of the board 102 to the second side of the board 102. In this way, the apertures 212 can remove heat from the electrical components 104, 303 on the first side and the second side of the board 102. In addition, the circulation of the dielectric liquid within the liquid chamber 110 can more efficiently transfer heat from the dielectric liquid to the first housing segment 106-1 and/or the second housing segment 106-2.

As described herein, the liquid chamber 110 can be filled with a liquid such as a dielectric liquid. As described herein, the liquid chamber 110 can be filled with a dielectric liquid to provide immersion cooling for electrical components 104 positioned on a first side of the board 102 within the liquid chamber 110 and for electrical components 303 positioned on a second side of the board 102 within the liquid chamber 110. For example, heat generated by the electrical components 104, 303 can be transferred to the dielectric liquid within the liquid chamber 110. In this example, the heat transferred into the dielectric liquid can be transferred to the first housing segment 106-1 and/or the second housing segment 106-2. In some examples, the liquid chamber 110 can provide immersion cooling to the electrical components 104 positioned on a first portion of the circuit assembly 300 while allowing electrical components positioned on a second portion of the circuit assembly 300 to be cooled by a different cooling device and/or cooling system.

In some examples, the circuit assembly 300 can be utilized to provide immersion cooling for electrical components 104, 303 positioned on either side of the circuit assembly 300 within the liquid chamber 110 while utilizing a different cooling method or cooling system for electrical components positioned outside the liquid chamber 110. In addition, the circuit assembly 300 can be utilized with other types of cooling methods and/or cooling systems as described further herein.

Figure 4:
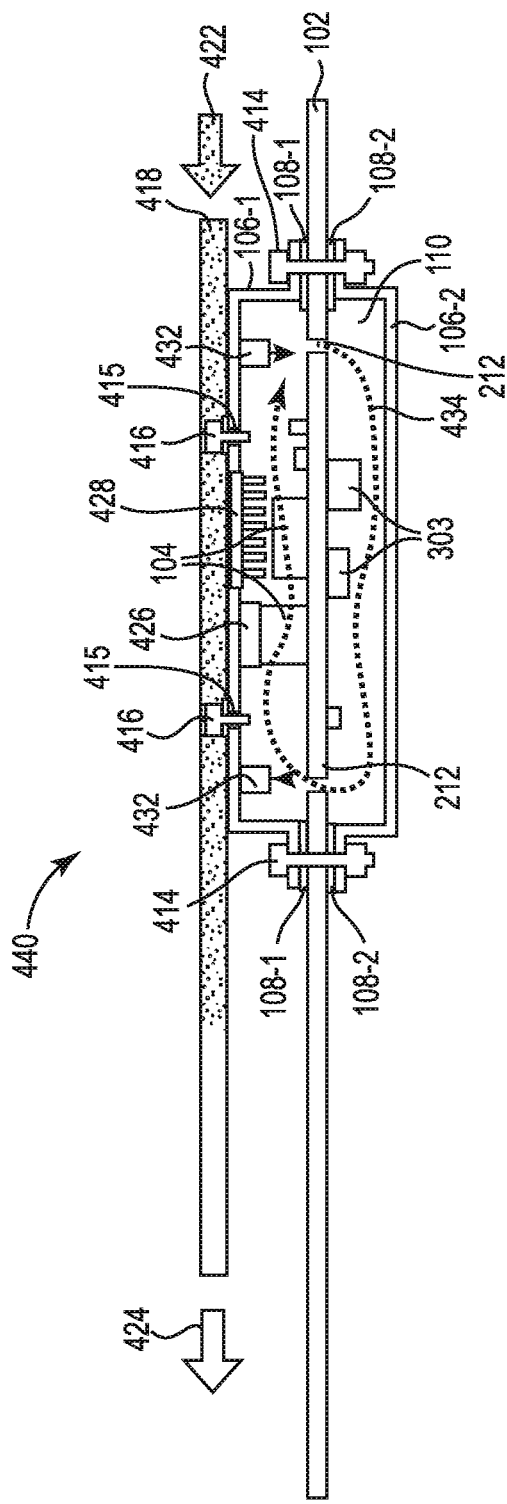
FIG. 4 illustrates an example system comprising housing segments to generate a liquid chamber.

FIG. 4 illustrates an example system 440 for liquid chamber housings. In some examples, the system 440 can include a similar circuit assembly to the circuit assembly 100 as referenced in FIG. 1, circuit assembly 200 as referenced in FIG. 2, and/or circuit assembly 300 as referenced in FIG. 3. For example, the system 440 can be utilized to generate a liquid chamber 110 with a first housing segment 106-1 and a second housing segment 106-2 to enclose a first portion of electrical components 104 coupled to a first side of a board 102 and a second portion of electrical components 303 coupled to a second side of the board 102. Specifically, the system 440 illustrates the elements from circuit assembly 100, circuit assembly 200, circuit assembly 300, with filler apertures 415 and movement devices 432 for circulating the dielectric liquid within the liquid chamber 110 along arrow 434.

As used herein, a liquid chamber 110 can include an area that can include a liquid tight sealed area that can receive a liquid such as a dielectric liquid that can remove heat from electrical components 104 and/or electrical components 303. In some examples, the liquid chamber 110 can be constructed by a first housing segment 106-1 coupled to a first side of the board 102 by a retention device 414 and a second housing segment 106-2 coupled to a second side of the board 102 by the retention device 414. For example, the liquid chamber 110 can be constructed by a first housing segment 106-1 coupled to a top side of the board 102 of the circuit assembly 401 as illustrated in FIG. 4 and a second housing segment 106-2 coupled to a bottom side of the board 102 of the circuit assembly as illustrated in FIG. 4. In some examples, the liquid chamber 110 can be filled with a dielectric liquid through filler apertures 415 (e.g., filler holes, plugged apertures, etc.). For example, a dielectric liquid can be inserted into the filler apertures 415 to fill the liquid chamber 110. In other examples, the filler apertures 415 can be utilized to drain the liquid chamber 110 and/or remove the dielectric liquid from the liquid chamber 110. Although the filler apertures 415 and plugs 416 are described herein in relation to the system 440 for sake of illustration, it should be understood that any of the examples described herein may include plugged apertures and plugs like the filler apertures 415 and plugs 416 to enable liquid coolant to be added their liquid chamber 110.

In some examples, the retention devices 414 can be inserted in and/or through retention apertures positioned through the board 102. In some examples, the retention devices 414 may also be inserted in and/or through retention apertures in a rim or flange or perimeter of the housing segments 106, which are aligned with the retention apertures in the board 102. The retention devices 141 may be distributed around a perimeter of the housing segments 106. For example, the retention devices 414 can be screws, bolts/nuts, studs, rivets, or other mechanical fasteners that include a portion that can be positioned within a retention aperture (e.g., the cylindrical rod portion of a bolt) and a portion that is attached or attachable to the first portion and constrains the housing segments 106 (e.g., the head of a bolt and the nut to attach to the bolt). In some examples, the retention devices 414 can be tightened to apply pressure between a surface of the first housing segment 106-1 and a first gasket 108-1 or surface of a first side of the circuit assembly 102. In addition, the retention devices 414 can be tightened to apply pressure between a surface of the second housing segment 106-2 and the second gasket 108-2 or surface of a second side of the circuit assembly 102. Although two retention devices 414 are illustrated, it should be understood that any number of retention devices 414 could be used. In some examples, the retention devices 414 may include or may be replaced by non-mechanical fasteners that fasten the housing segments 106 to the board 102, such as adhesives, welding, solder, etc. Although the retention devices 414 are described herein in relation to the system 440 for sake of illustration, it should be understood that any of the examples described herein may include retention devices like the retention devices 414 to fasten their housing segments to the board 102.

In some examples, the system 440 can include a first gasket 108-1 and a second gasket 108-2. In some examples, the first gasket 108-1 can be positioned between the first housing segment 106-1 and a surface of the first side of the board 102. In some examples, the first gasket 108-1 can provide a liquid tight seal between the first housing segment 106-1 and the surface of the first side of the board 102. In this way, the first housing segment 106-1 and the first gasket 108-1 can generate a first portion of the liquid chamber 110 positioned on the first side of the board 110 to enclose the electrical components 104 coupled to the first side of the board 110. In a similar way, the second gasket 108-2 can be positioned between the second housing segment 106-2 and a surface of the second side of the board 102 to enclose the electrical components 303 coupled to the second side of the board 110.

In some examples, the board 102 can include apertures 212 or holes in the board 102. In some examples, the apertures 212 can allow the dielectric liquid within the liquid chamber 110 to move from the first side of the board 102 (e.g., top side, etc.) to the second side of the board 102 (e.g., bottom side, etc.) as illustrated by arrow 434. In some examples, allowing the dielectric liquid within the liquid chamber 110 to flow from the first side of the board 102 to the second side of the board 102 can allow heat to be transferred from the dielectric liquid into the first housing segment 106-1 and/or the second housing segment 106-2.

In some examples, a heat pipe, liquid cooling supply line 418, and/or other cooling device (e.g., thermal bus bar, air-cooled heatsink, etc.) can be thermally coupled to the first housing segment 106-1 and/or the second housing segment 106-2 to remove heat from the first housing segment 106-1 and/or the second housing segment 106-2. In some examples, the liquid cooling supply line 418 can be thermally coupled to a surface of the first housing segment 106-1. For example, an interior surface of the first housing segment 106-1 can interact with a liquid or dielectric liquid within the liquid chamber 110 and an exterior surface of the first housing segment 106-1 can be thermally coupled to the liquid cooling supply line 418. As used herein, two bodies are thermally coupled when they are in direct contact without one another or when they are both in direct contact with a thermally conductive intermediary (or series of connected intermediaries), such as a thermal interface material (TIM), thermal gap pad, cold plate, heat spreader, heat pipe, etc. Thus, for example, the liquid cooling supply line 418 may be thermally coupled to the first housing segment 106-1 by being placed in contact with it (directly or via a TIM). As another example, the liquid cooling supply line 418 may be thermally coupled to the first housing segment 106-1 by connecting into a cold plate that is thermally coupled to the first housing segment 106-1.

As used herein, a liquid cooling supply line 418 can include a structure to move a liquid within the structure from a first location to a second location, such as a hose or pipe, for example. The liquid supply line 418 may be part of any type of liquid cooling system, which may include conventional liquid cooling systems. The liquid used in the liquid supply line 418 may be any liquid coolant, which may be the same as or different from the liquid coolant used in the chamber 110, including, for example, water or water-based solutions. In some examples, the liquid cooling supply line 418 can be connected to a chiller to lower a temperature of the liquid and/or a pump to circulate a liquid from a first location to a second location. In some examples, the liquid cooling supply line 418 can be utilized to remove heat from the surface of the first housing segment 106-1. As described herein, heat generated by the electrical components 104, 303 can be transferred into a dielectric liquid within the liquid chamber 110 via immersion cooling. In some examples, a liquid can be circulated within the liquid cooling supply line 418 in the direction of arrow 422 and arrow 424. In some examples, relatively cooler liquid from a chiller can be received at arrow 422 and relatively warmer liquid from transferring heat from the first housing segment 106-1 can be moved toward arrow 424. In this way, heat generated by the electrical components 104, 303 can be moved away from the system 440.

Because the system 440 (and other examples disclosed herein) can be coupled to any liquid cooling system, including conventional liquid cooling systems, to remove heat from the system 440, computer devices that incorporate the system 440 may be easily integrated into a variety of server infrastructures without requiring special racks or other equipment that full immersion cooling might require. In addition, because the liquid coolant in the main liquid cooling system does not have to be the same as the liquid coolant included in the apparatus, in some examples, the cost of the overall cooling solution may be reduced, since cheaper liquid coolant (e.g., water) may be used in the main liquid cooling system and the more expensive dielectric liquid may be used in just the chamber 110. Although the liquid cooling line 418 is described herein in relation to the system 440 for sake of illustration, it should be understood that any of the examples described herein may be coupled to liquid cooling lines like the liquid cooling line 418 or to other cooling systems (e.g. air-cooled heatsinks, etc.).

In some examples, the apertures 212 within the board 102 can allow the dielectric liquid to provide immersion cooling to the electrical components 104 positioned on the first side of the board 102 and to the electrical components 303 positioned on the second side of the board 102. In some examples, the apertures 212 can be utilized to circulate the dielectric liquid or liquid within the liquid chamber 110 from the first side of the board 102 to the second side of the board 102 as illustrated by arrow 434. In this way, the apertures 212 can remove heat from the electrical components 104, 303 on the first side and the second side of the board 102. In addition, the circulation of the dielectric liquid within the liquid chamber 110 can more efficiently transfer heat from the dielectric liquid to the first housing segment 106-1 and/or the second housing segment 106-2.

As described herein, the liquid chamber 110 can be filled with a liquid such as a dielectric liquid. As described herein, the liquid chamber 110 can be filled with a dielectric liquid to provide immersion cooling for electrical components 104 positioned on a first side of the board 102 within the liquid chamber 110 and for electrical components 303 positioned on a second side of the board 102 within the liquid chamber 110. For example, heat generated by the electrical components 104, 303 can be transferred to the dielectric liquid within the liquid chamber 110. In this example, the heat transferred into the dielectric liquid can be transferred to the first housing segment 106-1 and/or the second housing segment 106-2. In some examples, the liquid chamber 110 can provide immersion cooling to the electrical components 104 positioned on a first portion of the board 102 while allowing electrical components positioned on a second portion of the board 102 to be cooled by a different cooling device and/or cooling system.

In some examples, the dielectric liquid within the liquid chamber 110 can be circulated by coupling the liquid cooling supply line 418 to a surface of the first housing segment 106-1. For example, removing heat from first housing segment 106-1 with the liquid cooling supply line 418 can create a temperature differential of the dielectric liquid between the first side of the board 102 and the second side of the board 102, which can cause a circulation of the dielectric liquid. In some examples, the system 440 can include a liquid movement device 432 to circulate a dielectric liquid within the liquid chamber 110 from the first side of the board 102 to the second side of the board 102 through apertures 212 positioned through the board 102. As used herein, the liquid movement device 432 can include devices that can move a liquid from a first location to a second location (e.g., from the first side of the board 102 to the second side of the board 102, etc.). The liquid movement devices 432 could include, for example, liquid-driven propellers, electric propellers, piezo-electric pumps, or other types of devices that are capable of moving liquid from a first location to a second location. The liquid movement device 432 may receive power, for example, via cables (not illustrated) that are connected to power sources (e.g., fan pins) (not illustrated) on the board 212 within the chamber 110. Although the liquid movement devices 432 are described herein in relation to the system 440 for sake of illustration, it should be understood that any of the examples described herein may include liquid movement devices like the liquid movement device 432.

In some examples, the system 440 can include a cooling structure 426 within the chamber 110 that is coupled to either of the housing segments 106 and in contact with a heat generating device (e.g., electronic component 104, etc.) coupled to the first side of the circuit assembly 102. In some examples, the cooling structure 426 can include a device that can transfer heat from an electrical component or heat generating device to the first housing segment 106-1. For example, the cooling structure 426 can include a thermal interface material (e.g., GAP pad, etc.). In some examples, a conduction block or cooling structure 426 can be coupled to an electrical component 104 of the plurality of electrical components and the first housing segment 106-1 of the liquid chamber 110. Such cooling structures 426 may increase the efficiency of heat transfer between the device to which they are attached and the housing segment 106, since a conductive path or heat pipe may, in some circumstances, transfer heat faster than the dielectric liquid would. Thus, the cooling structures 426 may be particularly useful for devices in the chamber 110 that generate high amounts of heat and/or that have surfaces that can provide good contact between the device and cooling structure 426 (e.g., larger and more uniform surfaces are better). In some examples, the system 440 can include a finned structure 428 coupled to the first housing segment 106-1 to interact with a liquid (e.g., dielectric liquid, etc.) between the first housing segment 106-1 and the second housing segment 106-2 (e.g., liquid chamber 110 constructed by the first housing segment 106-1 and the second housing segment 106-2). In some examples, the finned structure 428 can increase a transfer of heat from the dielectric liquid within the liquid chamber 110 to the first housing segment 106-1.

In some examples, the system 440 can be utilized to provide immersion cooling for electrical components 104, 303 positioned on either side of the board 102 within the liquid chamber 110 while utilizing a different cooling method or cooling system for electrical components positioned outside the liquid chamber 110. In addition, the system 440 can be utilized with other types of cooling methods and/or cooling systems as described further herein.

Figure 5:
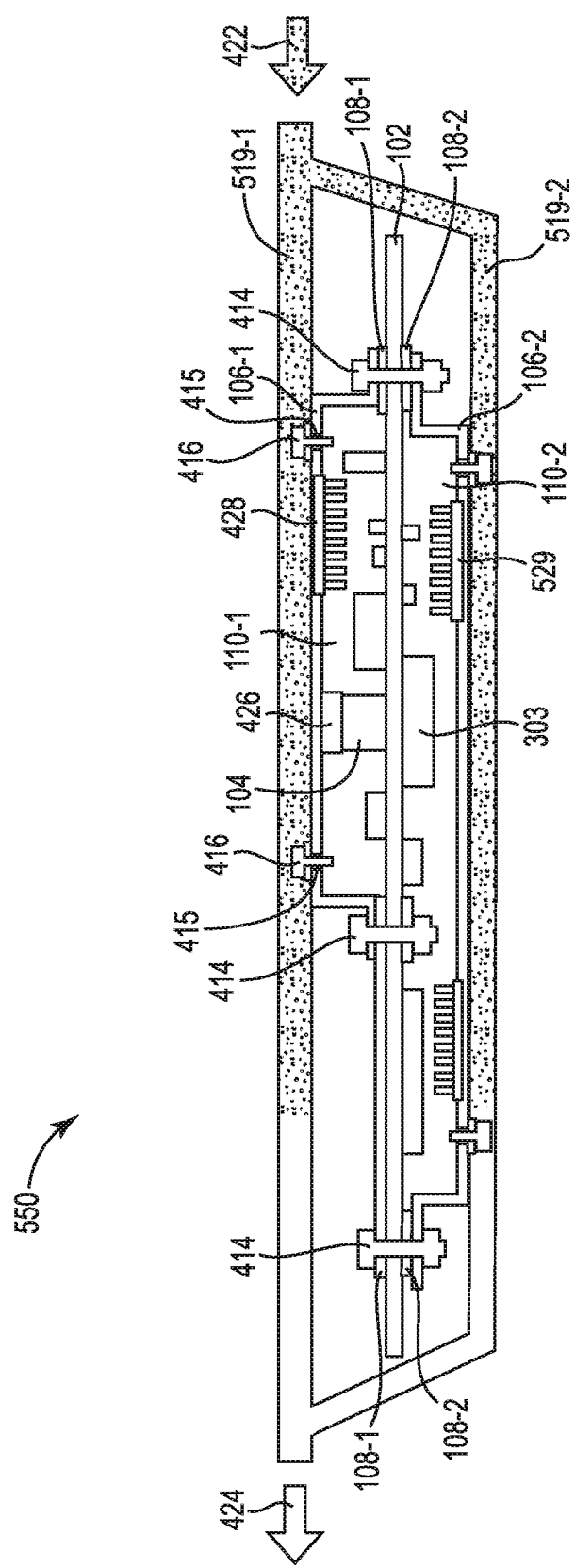
FIG. 5 illustrates an example system comprising housing segments to generate a liquid chamber.

FIG. 5 illustrates an example system 550 for liquid chamber housings. In some examples, the system 550 can include a similar circuit assembly to the circuit assembly 100 as referenced in FIG. 1, circuit assembly 200 as referenced in FIG. 2, and/or circuit assembly 300 as referenced in FIG. 3. In addition, the system 550 can include the same or similar elements as system 440 as referenced in FIG. 4. For example, the system 550 can be utilized to generate a liquid chamber 110 with a first housing segment 106-1 and a second housing segment 106-2 to enclose a first portion of electrical components 104 coupled to a first side of a board 102 and a second portion of electrical components 303 coupled to a second side of the board 102. Specifically, the system 550 illustrates the elements from system 440 with liquid cooling supply line 519-1, 519-2 that interact with the first housing segment 106-1 and the second housing segment 106-2.

As used herein, a liquid chamber 110-1, 110-2 can include an area that can include a liquid tight sealed area that can receive a liquid such as a dielectric liquid that can remove heat from electrical components 104 and/or electrical components 303. In some examples, the liquid chamber 110-1 can be constructed by a first housing segment 106-1 coupled to a first side of the board 102 by a retention device 414 and the liquid chamber 110-2 can be constructed by a second housing segment 106-2 coupled to a second side of the board 102 by the retention device 414. For example, the liquid chamber 110-1 can be constructed by a first housing segment 106-1 coupled to a top side of the board 102 as illustrated in FIG. 5 and the liquid chamber 110-2 can be constructed by a second housing segment 106-2 coupled to a bottom side of the board 102 as illustrated in FIG. 5.

In some examples, the board 102 may not include apertures to allow the dielectric fluid to flow from the first side of the board 102 to the second side of the board 102. For example, the dielectric fluid may not be able to move from the liquid chamber 110-1 to the liquid chamber 110-2. In this way, liquid chamber 110-1 and liquid chamber 110-2 can be independent liquid chambers and/or separated liquid chambers. In these examples, each of the liquid chambers 110-1, 110-2 can each include filler apertures 415 to allow the liquid chamber 110-1 to be filled or emptied and separately allow the liquid chamber 110-2 to be filled or emptied. In some examples, the independent liquid chambers 110-1, 110-2 can be advantageous when the liquid chamber 110-1 and liquid chamber 110-2 are differently sized as illustrated in FIG. 5. In addition, the liquid chambers 110-1, 110-2 can be utilized to cool differently types of electrical components 104, 303, which may generate different quantities of heat. In these examples, the liquid supply line 519-1 and liquid supply line 519-2 can also be utilized separately based on the type of electrical components 104, 303 and/or size of the liquid chambers 110-1, 110-2. For example, the liquid supply line 519-1 can have a first heat removal capability based on the liquid chamber 110-1 and/or thermal profile of electrical components 104 while the liquid supply line 519-2 can have a second heat removal capability based on the liquid chamber 110-2 and/or thermal profile of electrical components 303.

In some examples, the liquid chamber 110-1, 110-2 can be filled with a dielectric liquid through filler apertures 415. For example, a dielectric liquid can be inserted into the filler apertures 415 to fill the liquid chamber 110-1, 110-2. In other examples, the filler apertures 415 can be utilized to drain the liquid chamber 110-1, 110-2 and/or remove the dielectric liquid from the liquid chamber 110-1, 110-2. In some examples, the filler apertures 415 can be liquid sealed utilizing plugs 416. In some examples, the plugs 416 can be pressed into the filler apertures 415 to prevent the dielectric liquid from escaping the liquid chamber 110-1, 110-2 through the filler apertures 415. The plugs 416 can be screw plugs that can include a thread that corresponds to a thread within the filler apertures 415 to generate a liquid seal between the plugs 416 and the filler apertures 415.

In some examples, the retention device 414 can be positioned within a retention aperture positioned through the board 102. For example, the retention device 414 can be a first screw or bolt that can be positioned within a first retention aperture and the retention device 414 can be a second screw or bolt that be positioned within a second retention aperture. In some examples, the retention devices 414 can be tightened to apply pressure between a surface of the first housing segment 106-1 and a first gasket 508-1 or surface of a first side of the board 102. In addition, the retention devices 414 can be tightened to apply pressure between a surface of the second housing segment 106-2 and the second gasket 508-2 or surface of a second side of the board 102.

In some examples, the system 550 can include a first gasket 508-1 and a second gasket 508-2. In some examples, the first gasket 508-1 can be positioned between the first housing segment 106-1 and a surface of the first side of the board 102. In some examples, the first gasket 508-1 can provide a liquid tight seal between the first housing segment 106-1 and the surface of the first side of the board 102. In this way, the first housing segment 106-1 and the first gasket 508-1 can generate a first portion of the liquid chamber 110-1, 110-2 positioned on the first side of the board 102 to enclose the electrical components 104 coupled to the first side of the board 102. In a similar way, the second gasket 508-2 can be positioned between the second housing segment 106-2 and a surface of the second side of the board 102 to enclose the electrical components 303 coupled to the second side of the board 110-1, 110-2.

In some examples, the first housing segment 106-1 can be a different size and/or shape than the second housing segment 106-2. For example, the first housing segment 106-1 can cover a first portion or area of the first side of the board 102 and the second housing segment 106-2 can cover a second portion or area of the second side of the board 102. In some examples, the first portion or area can be a different size than the second portion or area. In some examples, the first gasket 508-1 can extend beyond a perimeter of the first housing segment when the second housing segment 106-2 is relatively larger or covers a different portion of the board 102. For example, the first gasket 508-1 can extend beyond the perimeter of the first housing segment 106-1 to cover and/or seal an area of the second housing segment 106-2 that extends beyond the perimeter of the first housing segment 106-1. In this way, the system 550 can be utilized to enclose a first portion of a first side of the board 102 and enclose a second portion that is different than the first portion of a second side of the board 102. In this way, each side of the circuit assembly 501 can be selectively enclosed and/or exposed to provide immersion cooling to a selected portion of each of the sides of the circuit assembly 501.

In some examples, a heat pipe, liquid cooling supply line 519-1, 519-2, and/or other cooling device can be coupled to the first housing segment 106-1 and/or the second housing segment 106-2 to remove heat from the first housing segment 106-1 and/or the second housing segment 106-2. In some examples, the liquid cooling supply line 519-1 can be coupled to a surface of the first housing segment 106-1 and a liquid cooling supply line 519-2 can be coupled to a surface of the second housing segment 106-2. For example, an interior surface of the first housing segment 106-1 can interact with a liquid or dielectric liquid within the liquid chamber 110-1, 110-2 and an exterior surface of the first housing segment 106-1 can be coupled to the liquid cooling supply line 519-1. In another example, an interior surface of the second housing segment 106-2 can interact with a liquid or dielectric liquid within the liquid chamber 110-1, 110-2 and an exterior surface of the second housing segment 106-2 can be coupled to the liquid cooling supply line 519-2. In this way, heat transferred from the electrical components 104, 303 to the dielectric liquid within the liquid chamber 110-1, 110-2 can be transferred into the liquid cooling supply line 519-1, 519-2.

As used herein, a liquid cooling supply line 519-1, 519-2 can include a structure to move a liquid within the structure from a first location to a second location. In some examples, the liquid cooling supply line 519-1, 519-2 can be connected to a chiller to lower a temperature of the liquid and/or a pump to circulate a liquid from a first location to a second location. In some examples, the liquid cooling supply line 519-1 can be utilized to remove heat from the surface of the first housing segment 106-1 and the liquid cooling supply line 519-2 can be utilized to remove heat from the surface of the second housing segment 106-2. As described herein, heat generated by the electrical components 104, 303 can be transferred into a dielectric liquid within the liquid chamber 110-1, 110-2 via immersion cooling. In some examples, a liquid can be circulated within the liquid cooling supply line 519-1, 519-2 in the direction of arrow 422 and arrow 424. In some examples, relatively cooler liquid from a chiller can be received at arrow 422 and relatively warmer liquid from transferring heat from the first housing segment 106-1 and/or the second housing segment 106-2 can be moved toward arrow 424. In this way, heat generated by the electrical components 104, 303 can be moved away from the system 550.

As described herein, the liquid chamber 110-1, 110-2 can be filled with a liquid such as a dielectric liquid. As described herein, the liquid chamber 110-1, 110-2 can be filled with a dielectric liquid to provide immersion cooling for electrical components 104 positioned on a first side of the board 102 within the liquid chamber 110-1, 110-2 and for electrical components 303 positioned on a second side of the board 102 within the liquid chamber 110-1, 110-2. For example, heat generated by the electrical components 104, 303 can be transferred to the dielectric liquid within the liquid chamber 110-1, 110-2. In this example, the heat transferred into the dielectric liquid can be transferred to the first housing segment 106-1 and/or the second housing segment 106-2. In some examples, the liquid chamber 110-1, 110-2 can provide immersion cooling to the electrical components 104 positioned on a first portion of the board 102 while allowing electrical components positioned on a second portion of the board 102 to be cooled by a different cooling device and/or cooling system.

In some examples, the system 550 can include a cooling structure 426 coupled to the first housing segment 106-1 to contact a heat generating device (e.g., electronic component 104, etc.) coupled to the first side of the board 102. In some examples, the cooling structure 426 can include a device that can transfer heat from an electrical component or heat generating device to the first housing segment 106-1. For example, the cooling structure 426 can include a heat pipe and/or a thermal interface material (e.g., GAP pad, etc.). In some examples, the system 550 can include a finned structure 428 coupled to the first housing segment 106-1 and/or a finned structure 529 coupled to the second housing segment 106-2 to interact with a liquid (e.g., dielectric liquid, etc.) between the first housing segment 106-1 and the second housing segment 106-2 (e.g., liquid chamber 110-1, 110-2 constructed by the first housing segment 106-1 and the second housing segment 106-2). In some examples, the finned structure 428, 529 can increase a transfer of heat from the dielectric liquid within the liquid chamber 110-1, 110-2 to the first housing segment 106-1 and second housing segment 106-2.

In some examples, the system 550 can be utilized to provide immersion cooling for electrical components 104, 303 positioned on either side of the board 102 within the liquid chamber 110-1, 110-2 while utilizing a different cooling method or cooling system for electrical components positioned outside the liquid chamber 110-1, 110-2. In addition, the system 550 can be utilized with other types of cooling methods and/or cooling systems as described further herein.

Figure 6:
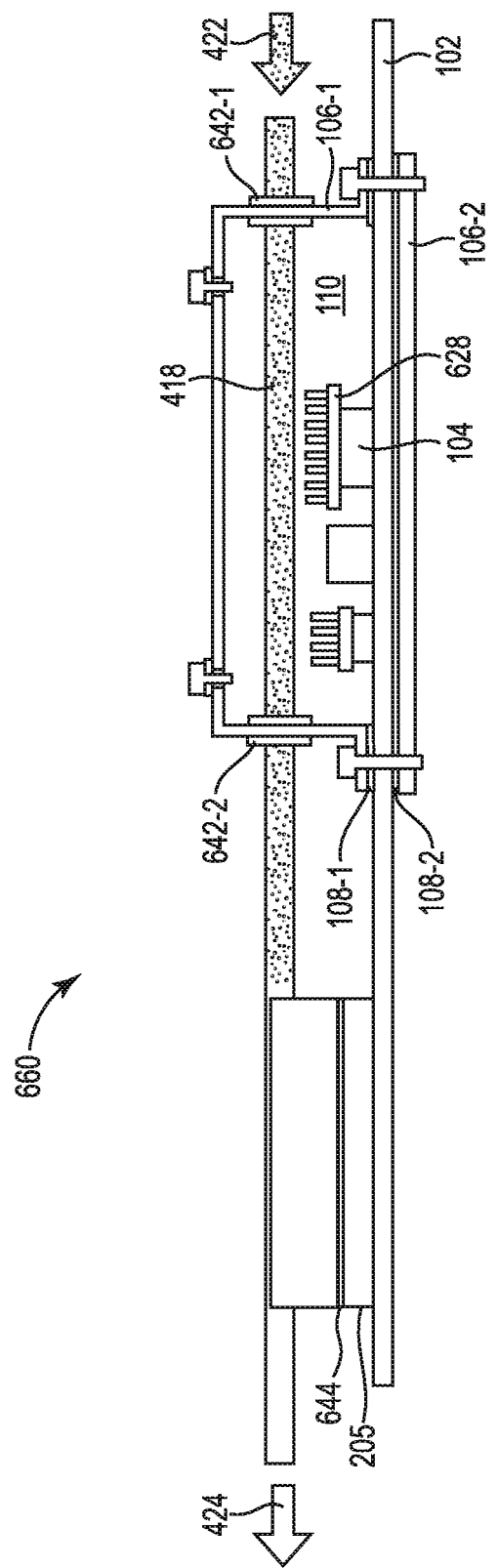
FIG. 6 illustrates an example system comprising housing segments to generate a liquid chamber.

FIG. 6 illustrates an example system 660 for liquid chamber housings. In some examples, the system 660 can include a similar circuit assembly to the circuit assembly 100 as referenced in FIG. 1, circuit assembly 200 as referenced in FIG. 2, and/or circuit assembly 300 as referenced in FIG. 3. In addition, the system 660 can include the same or similar elements as system 440 as referenced in FIG. 4 and/or system 550 as referenced in FIG. 5. For example, the system 660 can be utilized to generate a liquid chamber 110 with a first housing segment 106-1 and a second housing segment 106-2 to enclose a portion of electrical components 104 coupled to a first side of a board 102 of a circuit assembly 601 and a not enclose a second portion of electrical components coupled to the first side of the board 102 of the circuit assembly 601. Specifically, the system 660 illustrates the elements from system 440 with a liquid cooling supply line 418 that is inserted through apertures 642-1, 642-2 to directly interact with the dielectric liquid within the liquid chamber 110.

As used herein, a liquid chamber 110 can include an area that can include a liquid tight sealed area that can receive a liquid such as a dielectric liquid that can remove heat from electrical components 104. In some examples, the liquid chamber 110 can be constructed by a first housing segment 106-1 coupled to a first side of the board 102 and a second housing segment 106-2 coupled to a second side of the board 102. For example, the liquid chamber 110 can be constructed by a first housing segment 106-1 coupled to a top side of the board 102 as illustrated in FIG. 6 and a second housing segment 106-2 coupled to a bottom side of the board 102 as illustrated in FIG. 6.

In some examples, the system 660 can include a first gasket 108-1 and a second gasket 108-2. In some examples, the first gasket 108-1 can be positioned between the first housing segment 106-1 and a surface of the first side of the board 102. In some examples, the first gasket 108-1 can provide a liquid tight seal between the first housing segment 106-1 and the surface of the first side of the board 102. In some examples, a heat pipe, liquid cooling supply line 418, and/or other cooling device can be coupled to the first housing segment 106-1 and/or the second housing segment 106-2 to remove heat from the first housing segment 106-1 and/or the second housing segment 106-2.

In some examples, a first aperture 642-1 can be positioned within the first housing segment 106-1 of the liquid chamber 110 to receive a first portion of a liquid cooling supply line 418 and a second aperture 642-2 can be positioned within the first housing segment 106-1 of the liquid chamber 110 to receive a second portion of the liquid cooling supply line 418, wherein the liquid cooling supply line 418 removes heat from a liquid tight sealed within the liquid chamber 110. In some examples, the liquid cooling supply line 418 can run through a first aperture 642-1 and a second aperture 642-2 of the first housing segment 106-1. In this way, the liquid cooling supply line 418 can directly interact with the dielectric liquid within the liquid chamber 110. As described herein, the dielectric liquid can remove heat from the electrical components 104 within the liquid chamber 110 and transfer the heat to the liquid cooling supply line 418 such that the heat is removed from the dielectric liquid within the liquid chamber 110. In some examples, the first aperture 642-1 and the second aperture 642-2 can be sealed with corresponding gaskets or grommets. For example, a gasket can be positioned around the perimeter of the first aperture 642-1 and a gasket can be positioned around the perimeter of the second aperture 642-2 to provide a liquid tight seal between the liquid cooling supply line 418 and the first aperture 642-1 and/or the second aperture 642-2.

In the example illustrated in FIG. 6, the interior volume the liquid cooling supply line 418 is not communicably connected with the chamber 110. In other words, in the example illustrated in FIG. 6, the liquid carried in the liquid cooling supply line 418 does not mix with the dielectric liquid contained in the chamber 110. Thus, heat transfers from the dielectric liquid in the chamber 110 to the liquid in the liquid cooling supply line 418 via conduction through the walls of the liquid cooling supply line 418.

In other examples (not illustrated), the liquid cooling supply line 418 may connect to the apertures 642 so as to communicably connect the interior volumes of the liquid cooling supply line 418 with the chamber 110. In such examples, the segment of the liquid cooling supply line 418 that extends between the apertures 642 in FIG. 6 would be omitted, and liquid from the upstream side of the liquid cooling supply line 418 would enters the chamber 110 via the aperture 642-1 and mix with the liquid in the chamber 110, and liquid would exit from the chamber 110 into the downstream side of the liquid supply line 418 via the aperture 642-2. In such examples, the apertures 642 may include liquid couplings, such as dry-disconnect liquid couplings. Because the liquids would mix, this example may be more expensive in some circumstances than the illustrated example, since dielectric liquid would need to be used throughout the cooling system and not just in the chamber 110. However, it may be beneficial in some circumstances in that the flow within the chamber 110 caused by the liquid supply line 418 may help circulate the liquid therein, and the direct mixing of the liquids may result in more efficient heat transfer.

As used herein, a liquid cooling supply line 418 can include a structure to move a liquid within the structure from a first location to a second location. In some examples, the liquid cooling supply line 418 can be connected to a chiller to lower a temperature of the liquid and/or a pump to circulate a liquid from a first location to a second location. As described herein, heat generated by the electrical components 104 can be transferred into a dielectric liquid within the liquid chamber 110 via immersion cooling. In some examples, a liquid can be circulated within the liquid cooling supply line 418 in the direction of arrow 422 and arrow 424. In some examples, relatively cooler liquid from a chiller can be received at arrow 422 and relatively warmer liquid from transferring heat from the first housing segment 106-1 and/or the second housing segment 106-2 can be moved toward arrow 424. In this way, heat generated by the electrical components 104 can be moved away from the system 660.

As described herein, the liquid chamber 110 can be filled with a liquid such as a dielectric liquid. As described herein, the liquid chamber 110 can be filled with a dielectric liquid to provide immersion cooling for electrical components 104 positioned on a first side of the board 102 within the liquid chamber 110. For example, heat generated by the electrical components 104 can be transferred to the dielectric liquid within the liquid chamber 110. In this example, the heat transferred into the dielectric liquid can be transferred to the liquid cooling supply line 418. In some examples, the liquid chamber 110 can provide immersion cooling to the electrical components 104 positioned on a first portion of the board 102 while allowing electrical components positioned on a second portion of the board 102 to be cooled by a different cooling device and/or cooling system. For example, a cold plate 644 that utilizes the liquid from the liquid cooling supply line 418 can be utilized to cool or remove heat from electrical components 205 positioned outside the liquid chamber 110. As used herein, a cold plate 644 can include a structure to utilize liquid circulated by a liquid cooling supply line 418 to cool a heat generating component such as an electrical component 205.

In some examples, the system 660 can include a finned structure 628 coupled to an electrical component 104 to interact with a liquid (e.g., dielectric liquid, etc.) between the first housing segment 106-1 and the second housing segment 106-2 (e.g., liquid chamber 110 constructed by the first housing segment 106-1 and the second housing segment 106-2). In some examples, a finned structure 628 can be coupled to an electrical component 104 of the plurality of electrical components, wherein a portion of the finned structure 628 is in contact with the first housing segment 106-1 of the liquid chamber 110. In some examples, the finned structure 628 can increase a transfer of heat from the electrical component 104 into the dielectric liquid within the liquid chamber 110.

In some examples, the system 660 can be utilized to provide immersion cooling for electrical components 104 positioned on either side of the board 102 within the liquid chamber 110 while utilizing a different cooling method or cooling system for electrical components positioned outside the liquid chamber 110. In addition, the system 660 can be utilized with other types of cooling methods and/or cooling systems as described further herein.

Figure 7:
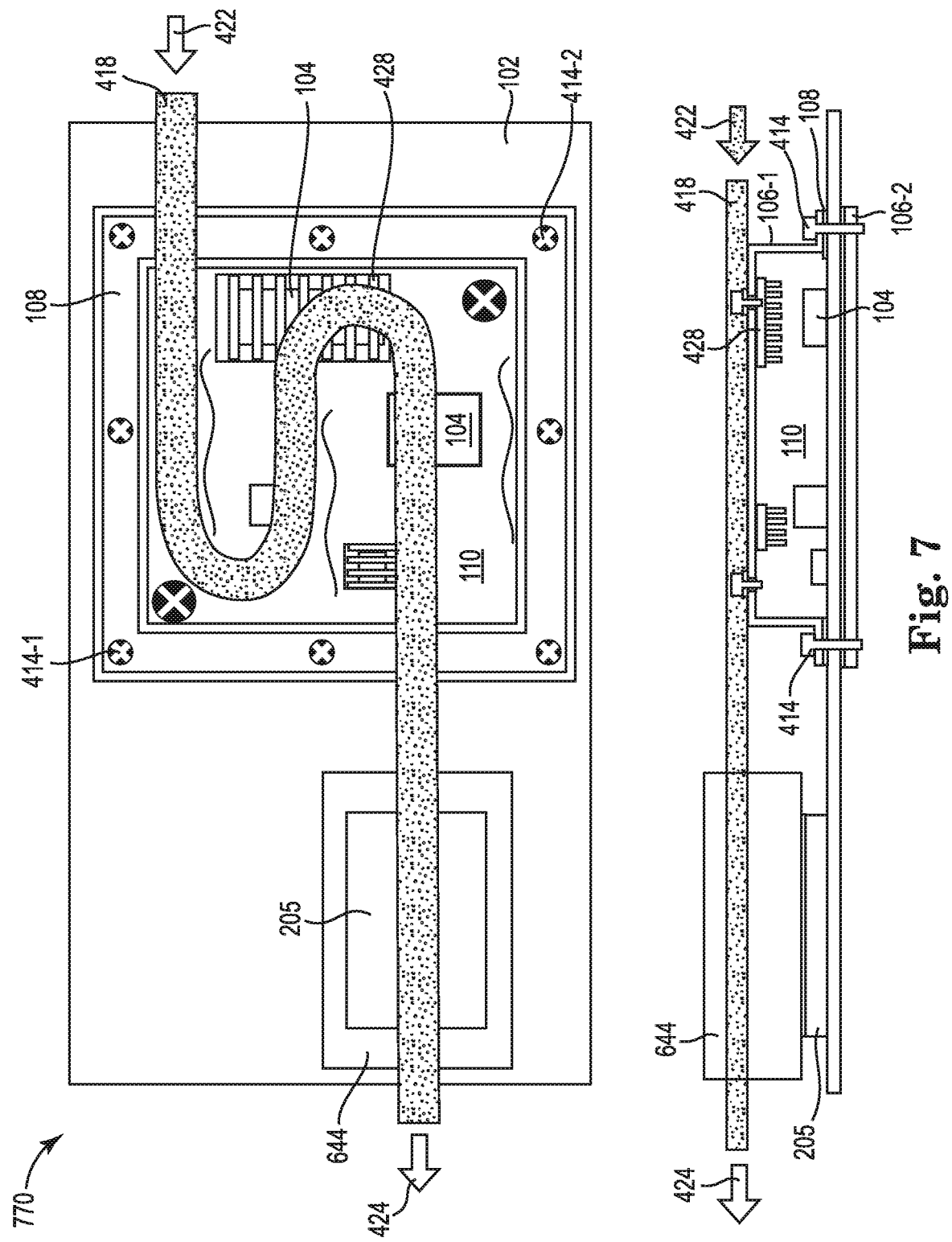
FIG. 7 illustrates an example system comprising housing segments to generate a liquid chamber.

FIG. 7 illustrates an example system 770 for liquid chamber housings. FIG. 7 illustrates a top side view of the system 770 toward the top of FIG. 7 and illustrates a side view of the system 770 toward the bottom of FIG. 7. In some examples, the system 770 can include a similar circuit assembly to the circuit assembly 100 as referenced in FIG. 1, circuit assembly 200 as referenced in FIG. 2, and/or circuit assembly 300 as referenced in FIG. 3. In addition, the system 770 can include the same or similar elements as system 440 as referenced in FIG. 4, system 550 as referenced in FIG. 5, and/or system 660 as referenced in FIG. 6. For example, the system 770 can be utilized to generate a liquid chamber 110 with a first housing segment 106-1 and a second housing segment 106-2 to enclose a first portion of electrical components 104 coupled to a first side of a board 102 of a circuit assembly and expose a second portion of electrical components 205 coupled to first side or second side of the board 102 of the circuit assembly. Specifically, the system 770 illustrates the elements from system 440 with liquid cooling supply line 418 that interacts with the first housing segment 106-1 and a cold plate 644.

As used herein, a liquid chamber 110 can include an area that can include a liquid tight sealed area that can receive a liquid such as a dielectric liquid that can remove heat from a first electrical component 104 and allow a second electrical component 205 to be cooled by a different cooling device or system (e.g., cold plate 644. In some examples, the liquid chamber 110 can be constructed by a first housing segment 106-1 coupled to a first side of the board 102 by a retention device 414 and a second housing segment 106-2 coupled to a second side of the board 102 by the retention device 414. For example, the liquid chamber 110 can be constructed by a first housing segment 106-1 coupled to a top side of the board 102 as illustrated in FIG. 7 and a second housing segment 106-2 coupled to a bottom side of the board 102 as illustrated in FIG. 7.

In some examples, the system 770 can include a gasket 108 positioned around a perimeter of the first housing segment 106-1. In some examples, the gasket 108 can be positioned between the first housing segment 106 and a surface of the first side of the board 102. In some examples, the gasket 108 can provide a liquid tight seal between the first housing segment 106-1 and the surface of the first side of the board 102. In this way, the first housing segment 106-1 and the gasket 108 can generate a first portion of the liquid chamber 110 positioned on the first side of the board 102 to enclose the electrical components 104 coupled to the first side of the board 102. In a similar way, a different gasket can be positioned between the second housing segment 106-2 and a surface of the second side of the board 102 to enclose the liquid chamber 110.

In some examples, a heat pipe, liquid cooling supply line 418, and/or other cooling device can be coupled to the first housing segment 106-1 and/or the second housing segment 106-2 to remove heat from the first housing segment 106-1 and/or the second housing segment 106-2. In some examples, the liquid cooling supply line 418 can be coupled to a surface of the first housing segment 106-1. For example, an interior surface of the first housing segment 106-1 can interact with a liquid or dielectric liquid within the liquid chamber 110 and an exterior surface of the first housing segment 106-1 can be coupled to the liquid cooling supply line 418. In another example, the liquid cooling supply line 418 can be positioned within the liquid chamber 110 through apertures as described herein. In this way, a first portion of the liquid supply line 418 can be positioned within the liquid chamber 110 and a second portion of the liquid cooling supply line 418 can be positioned outside the liquid chamber 110 to interact with other cooling systems such as a cold plate 644. In this example, the liquid cooling supply line 418 can be coupled to a cold plate 644 for cooling electrical component 205. In some examples, a first liquid cooling supply line 418 can be positioned on a component (e.g., electrical component 205, etc.) exposed from the liquid chamber and positioned on a surface of the first housing segment 106-1 of the liquid chamber 110. Thus, the electrical component 104 can be cooled through immersion cooling of the liquid chamber 110 and the electrical component 205 can be cooled by a cold plate 644.

As used herein, a liquid cooling supply line 418 can include a structure to move a liquid within the structure from a first location to a second location. In some examples, the liquid cooling supply line 418 can be connected to a chiller to lower a temperature of the liquid and/or a pump to circulate a liquid from a first location to a second location. As described herein, heat generated by the electrical component 104 can be transferred into a dielectric liquid within the liquid chamber 110 via immersion cooling. In some examples, a liquid can be circulated within the liquid cooling supply line 418 in the direction of arrow 422 and arrow 424. In some examples, relatively cooler liquid from a chiller can be received at arrow 422 and relatively warmer liquid from transferring heat from the dielectric liquid of the liquid chamber 110 can be moved toward arrow 424. In this way, heat generated by the electrical component 104 can be moved away from the system 770.

As described herein, the liquid chamber 110 can be filled with a liquid such as a dielectric liquid. As described herein, the liquid chamber 110 can be filled with a dielectric liquid to provide immersion cooling for electrical components 104 positioned on a first side of the board 102 within the liquid chamber 110. For example, heat generated by the electrical component 104 can be transferred to the dielectric liquid within the liquid chamber 110. In this example, the heat transferred into the dielectric liquid can be transferred to the liquid cooling supply line 418. In some examples, the liquid chamber 110 can provide immersion cooling to the electrical components 104 positioned on a first portion of the board 102 while allowing electrical components 205 positioned on a second portion of the board 102 to be cooled by a different cooling device and/or cooling system such as the cold plate 644.

In some examples, the system 770 can be utilized to provide immersion cooling for electrical components 104 positioned on either side of the board 102 of the circuit assembly within the liquid chamber 110 while utilizing a different cooling method or cooling system for electrical components 205 positioned outside the liquid chamber 110.

Figure 8:
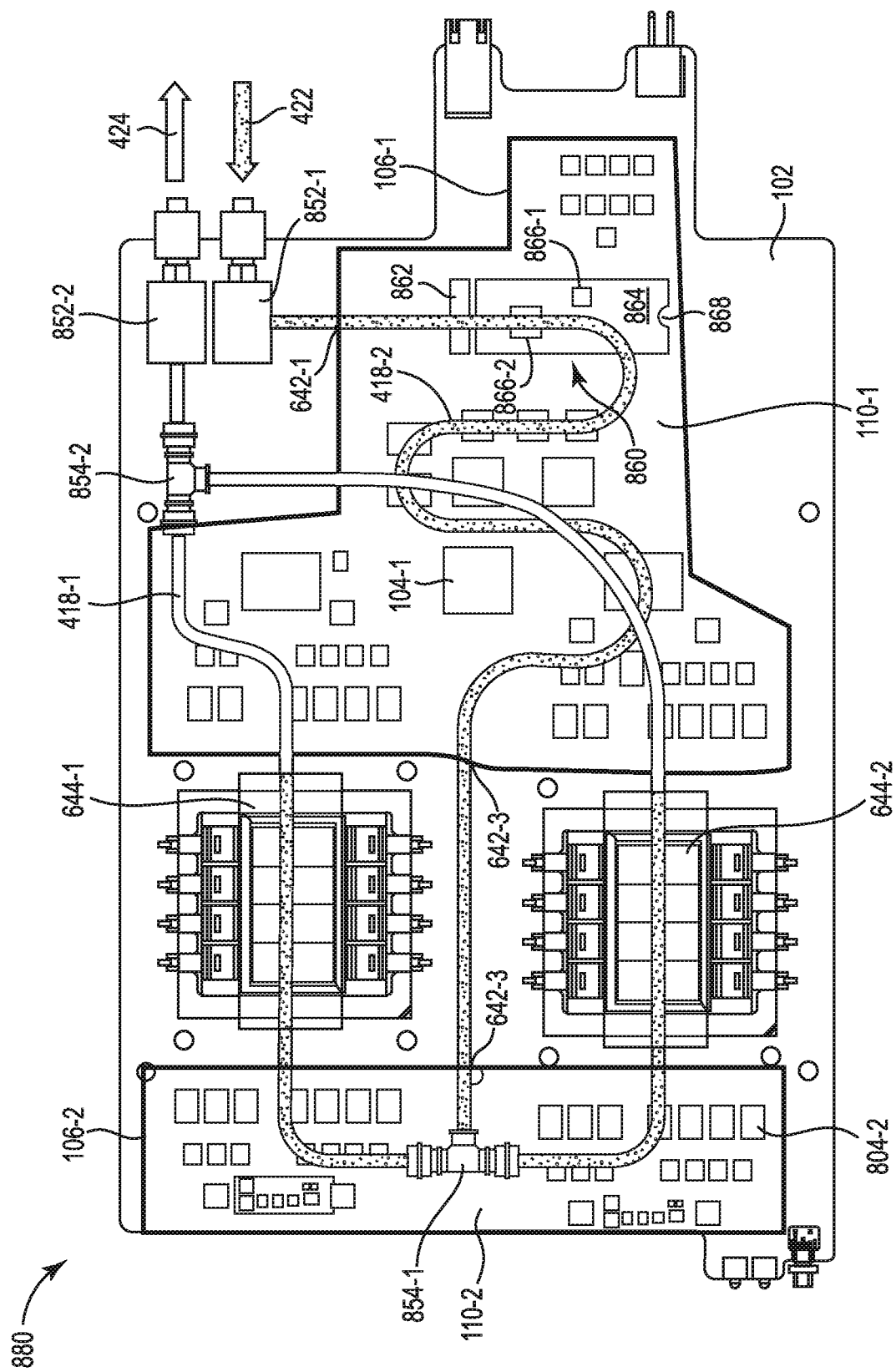
FIG. 8 illustrates an example system comprising housing segments to generate a liquid chamber.

FIG. 8 illustrates an example system 880 for liquid chamber housings. In some examples, the system 880 can include a similar circuit assembly to the circuit assembly 100 as referenced in FIG. 1, circuit assembly 200 as referenced in FIG. 2, and/or circuit assembly 300 as referenced in FIG. 3. In addition, the system 880 can include the same or similar elements as system 440 as referenced in FIG. 4, system 550 as referenced in FIG. 5, system 660 as referenced in FIG. 6, and/or system 770 as referenced in FIG. 7. For example, the system 880 can include a board 102 with a first liquid chamber 110-1 and a second liquid chamber 110-2. In this example, the first liquid chamber 110-1 can enclose a first portion of the board 102 and the second liquid chamber 110-2 can enclose a second portion of the board 102. Specifically, the system 880 illustrates the elements from system 660 with splitters 854-1, 854-2 to direct the liquid supply lines 418 through a plurality of liquid chambers 110-1, 110-2.

As described herein, the liquid chambers 110-1, 110-2 can each be constructed by a first housing segment and a second housing segment. In some examples, the first housing segment can be coupled to a first side of the board and the second housing segment can be coupled to a second side of the board. The first housing segments 106-1 are made transparent in FIG. 8 so enable the components 104 to be seen, but the thick line in the Figure indicates a perimeter of the first housing segments 106-1. As described herein, the liquid chambers 110-1, 110-2 can be utilized to provide immersion cooling to a portion of the electrical components positioned within the liquid chambers 110-1, 110-2 and allow for other types of cooling systems or methods to be utilized for electrical components positioned outside the liquid chambers 110-1, 110-2. For example, the liquid chambers 110-1, 110-2 can be utilized to provide immersion cooling for a first portion of electrical components and cold plates 644-1, 644-2 can be utilized to cool a second portion of electrical components.

In some examples, the system 880 can include an input liquid chamber 852-1 and an output liquid chamber 852-2. In some examples, the input liquid chamber 852-1 can be an input for a liquid cooling supply line 418-1, 418-2 and the output liquid chamber 852-2 can be an output for a liquid cooling supply line 418-1, 418-2. In some examples, the liquid cooling supply lines 418-1, 418-2 can be utilized to remove heat from the liquid chambers 110-1, 110-2 and/or providing liquid to cold plates 644-1, 644-2. In some examples, the liquid cooling supply lines 418-1, 418-2 can be inserted into the liquid chamber 110-1 through aperture 642-1 and/or aperture 642-2. In these examples, the liquid cooling supply lines 418-1, 418-2 can be exposed to a portion of the board 102 that is not enclosed to a liquid chamber 110-1, 110-2 and be inserted into liquid chamber 110-2 through aperture 642-3. In these examples, the liquid cooling supply lines 418-1, 418-2 can be coupled to a first splitter 854-1 which can direct the liquid cooling supply lines 418-1, 418-2 out of the liquid chamber 110-2 into a first cold plate 644-1 and/or a second cold plate 644-2. In these examples, the liquid cooling supply lines 418-1, 418-2 can be coupled to a second splitter 854-2 from the first cold plate 644-1 and/or the second cold plate 644-2. In these examples, the second splitter 845-2 can be coupled to the output liquid chamber 852-2.

In some examples, the input liquid chamber 852-1 can be an input that is coupled to an output of a chiller or heat exchanger that can lower a temperature of liquid within the liquid cooling supply lines 418-1, 418-2. In some examples, the output liquid chamber 852-2 can be an output that is coupled to an input of the chiller or heat exchanger. For example, relatively cooler liquid for the liquid cooling supply lines 418-1, 418-2 can be directed in the direction of arrow 422 and relatively warmer liquid from the system 880 can be removed in the direction of arrow 424. As used herein, a splitter (e.g., first splitter 854-1, second splitter 854-2, etc.) can be a device that can direct a liquid toward multiple directions or into multiple liquid cooling supply lines (e.g., liquid cooling supply lines 418-1, 418-2, etc.).

In some examples, the system 880 can include an adapter card assembly 860 that can couple an adapter card 864 to the board 102. As used herein, an adapter card 864 includes an expansion card that allows a computing device utilizing the board 102 to communicate with a peripheral device. For example, an adapter card 864 may be a non-volatile memory card for the computing device to store software programs, configuration data, utilization log data, security credentials, etc. In some examples, the system 880 can include an adapter retention device 868 to physically couple the adapter card 864 and/or the adapter card assembly 860 to the board 102. For example, the retention device 868 can include a thumbscrew or other type of retention device to couple the adapter card assembly 860 to the board 102. In some examples, the system 880 can include varying height components 866-1, 866-2. For example, the component 866-1 can include a first height from the board 102 and the component 866-2 can include a second height from the board 102. In this example, the first height and the second height can be different heights. In this way, the liquid chamber 110-1 can enclose and remove heat from the varying height components 866-1, 866-2.

In some examples, the system 880 can be utilized to provide immersion cooling for electrical components positioned on either side of the board 102 within the liquid chambers 110-1, 110-2 while utilizing a different cooling method or cooling system such as cold plates 644-1, 644-2 for electrical components positioned outside the liquid chambers 110-1, 110-2.

Elements shown in the various figures herein may be capable of being added, exchanged, and/or eliminated so as to provide a number of additional examples of the present disclosure. In addition, the proportion and the relative scale of the elements provided in the figures are intended to illustrate the examples of the present disclosure and should not be taken in a limiting sense. The above specification, examples and data provide a description of the methods and applications and use of the system and method of the present disclosure. Since many examples can be made without departing from the spirit and scope of the system and method of the present disclosure, this specification merely sets forth some of the many possible example configurations and implementations.

What is claimed:

1. An apparatus, comprising:
   a first housing segment coupled to a first side of a board of a circuit assembly;
   a second housing segment coupled to a second side of the board, wherein the first housing segment and the second housing segment create a liquid chamber that encloses a portion of the board between the first housing segment and the second housing segment, wherein the liquid chamber exposes a first component coupled to the first side of the board and encloses a second component coupled to the first side of the board; and
   a first liquid cooling supply line positioned on the first component exposed from the liquid chamber and positioned on a surface of the first housing segment of the liquid chamber.

2. The apparatus of claim 1, comprising a first gasket positioned between the first housing segment and the first side of the board and a second gasket positioned between the second housing segment and the second side of the board.

3. The apparatus of claim 2, wherein the first gasket is positioned to seal a border of the first housing segment and the second gasket is positioned to seal a border of the second housing segment.

4. The apparatus of claim 1, comprising a finned structure coupled to the first housing segment to interact with a liquid in the liquid chamber.

5. The apparatus of claim 1, comprising a cooling structure coupled to the first housing segment to contact a heat generating device coupled to the first side of the board.

6. The apparatus of claim 1, comprising apertures positioned through the board to allow a dielectric liquid to pass through the apertures between the first housing segment and the second housing segment.

7. The apparatus of claim 1, wherein the first housing segment transfers heat from a dielectric liquid positioned within the liquid chamber to the first liquid cooling supply line.

8. A circuit assembly, comprising:
a board;
a plurality of electrical components coupled to a first side of the board;
a first housing segment of a liquid chamber coupled to the first side of the board;
a second housing segment of the liquid chamber coupled to the second side of the board, wherein the first housing segment and the second housing segment form the liquid chamber that exposes a first component of the plurality of electrical components and encloses a second component of the plurality of electrical components on the first side of the board;
a first gasket positioned between the first housing segment of the liquid chamber and the first side of the board;
a second gasket positioned between the second housing segment of the liquid chamber and the second side of the board; and
a first liquid cooling supply line positioned on the first component exposed from the liquid chamber and positioned on a surface of the first housing segment of the liquid chamber.

9. The circuit assembly of claim 8, comprising a finned structure coupled to an electrical component of the plurality of electrical components, wherein a portion of the finned structure is in contact with the first housing segment of the liquid chamber.

10. The circuit assembly of claim 8, wherein the first housing segment extends across a first area of the first side of the board and the second housing segment extends across a second area of the second side of the board.

11. The circuit assembly of claim 8, comprising a conduction block coupled to an electrical component of the plurality of electrical components and the first housing segment of the liquid chamber.

12. The circuit assembly of claim 8, comprising a finned structure coupled to the first housing segment positioned within the liquid chamber.

13. The circuit assembly of claim 8, wherein a portion of the board is not sealed within the liquid chamber.

14. A system, comprising:
a board of a circuit assembly comprising a first component and a second component coupled to a first side of the board;
a first housing segment of a liquid chamber coupled to the first side of the board to cover the second component and expose the first component;
a second housing segment of the liquid chamber coupled to the second side of the board, the first housing segment and the second housing segment forming the liquid chamber enclosing the second component; and
a first liquid cooling supply line positioned on the first component exposed from the liquid chamber and positioned on a surface of the first housing segment of the liquid chamber.

15. The system of claim 14, comprising a third component coupled to a second side of the board, the second housing segment covering the third component.

16. The system of claim 14, comprising a second liquid cooling supply line positioned on a third component exposed from the liquid chamber and positioned on a surface of the second housing segment of the liquid chamber.

17. The system of claim 16, wherein the first liquid cooling supply is positioned through an input aperture and an output aperture of the first housing segment of the liquid chamber to interact with a liquid tight sealed between the first housing segment and the second housing segment.

18. The system of claim 14, comprising a liquid movement device to circulate a dielectric liquid within the liquid chamber from the first side of the board to the second side of the board through apertures positioned through the board.

* * * * *